(12) United States Patent
Parkhe

(10) Patent No.: US 12,020,912 B2
(45) Date of Patent: Jun. 25, 2024

(54) INTEGRATED ELECTRODE AND GROUND PLANE FOR A SUBSTRATE SUPPORT

(71) Applicant: Applied Materials, Inc., Santa Clara, CA (US)

(72) Inventor: Vijay D. Parkhe, San Jose, CA (US)

( * ) Notice: Subject to any disclaimer, the term of this patent is extended or adjusted under 35 U.S.C. 154(b) by 841 days.

(21) Appl. No.: 17/027,393

(22) Filed: Sep. 21, 2020

(65) Prior Publication Data
US 2021/0104384 A1    Apr. 8, 2021

Related U.S. Application Data

(60) Provisional application No. 62/911,729, filed on Oct. 7, 2019.

(51) Int. Cl.
*H01J 37/32* (2006.01)

(52) U.S. Cl.
CPC .. *H01J 37/32724* (2013.01); *H01J 37/32174* (2013.01); *H01J 37/32568* (2013.01); *H01J 2237/0266* (2013.01)

(58) Field of Classification Search
CPC .......... H01L 21/67248; H01L 21/67103; H01J 37/32715; H01J 37/32568; H01J 37/32174
See application file for complete search history.

(56) References Cited

U.S. PATENT DOCUMENTS

| | | |
|---|---|---|
| 5,880,924 A | 3/1999 | Kumar et al. |
| 2005/0264219 A1* | 12/2005 | Dhindsa ............ H01J 37/32091 315/111.21 |
| 2012/0046602 A1 | 2/2012 | Morfill et al. |
| 2017/0167790 A1* | 6/2017 | Gaff ...................... H05B 3/0014 |
| 2017/0186590 A1* | 6/2017 | Wu .................... H01L 21/68735 |
| 2017/0306494 A1* | 10/2017 | Lin .................... H01J 37/32082 |
| 2018/0033672 A1* | 2/2018 | Woytowitz .......... C23C 16/4581 |
| 2018/0218885 A1* | 8/2018 | Maeda ............... H01J 37/32724 |

FOREIGN PATENT DOCUMENTS

| | | |
|---|---|---|
| JP | H11-214494 A | 8/1999 |
| JP | 2019140155 A | 8/2019 |

OTHER PUBLICATIONS

International Search Report and Written Opinion in related application PCT/US2020/051835 dated Dec. 30, 2020.
Japanese Office Action for Japanese Patent Application No. 2022-520962 dated Jul. 11, 2023.

* cited by examiner

*Primary Examiner* — Thien S Tran
(74) *Attorney, Agent, or Firm* — Patterson + Sheridan, LLP

(57) ABSTRACT

Embodiments described herein relate to apparatus for radio frequency (RF) grounding in process chambers. In one embodiment, a heater is disposed in a substrate support. The heater is surrounded by a ground shield assembly. The substrate support also includes a multi-zone electrode disposed therein. The multi-zone electrode includes one or more portions of an electrode disposed in a plane. One or more portions of a multi-zone ground plane are interposed with the one or more portions of the electrode. That is, the multi-zone ground plane and the multi-zone electrode are coplanar with the one or more portions of the electrode alternating with one or more portions of the multi-zone ground plane throughout a plane of the substrate support.

20 Claims, 4 Drawing Sheets

INTEGRATED ELECTRODE AND GROUND PLANE FOR A SUBSTRATE SUPPORT

CROSS-REFERENCE TO RELATED APPLICATION

This application claims benefit of U.S. Provisional Patent Application Ser. No. 62/911,729, filed Oct. 7, 2019, which is incorporated by reference herein.

BACKGROUND

Field

Embodiments of the present disclosure generally relate to a substrate support for substrate processing, and more specifically to an integrated electrode and ground plane in a substrate support.

Description of the Related Art

In the manufacture of integrated circuits and other electronic devices, plasma processes are often used for deposition or etching of various material layers. Plasma processing offers many advantages over thermal processing. For example, plasma enhanced chemical vapor deposition (PECVD) allows deposition processes to be performed at lower temperatures and at higher deposition rates than achievable in analogous thermal processes.

Plasma processing, such as plasma enhanced chemical vapor deposition (PECVD), is used to deposit materials, such as blanket dielectric films on substrates. Radio frequency (RF) power may be used to activate process gases in a process chamber. The RF power has a tendency to return to the source. In some cases, RF power is lost in various areas of the chamber due to formation of stray plasmas. Arcing can occur from the RF power in the process chamber which can damage the chamber and components thereof. A ground path is provided to direct the RF power in predetermined areas in a more controlled manner away from particular areas of the process chamber to prevent loss or damage thereto and attempt to reduce an occurrence of stray plasmas or arcing in the process chamber. However, current ground path designs are complicated and result in arcing, stray plasmas, or non-symmetrical ground paths leading to variations in the plasma processing. Further, current ground path designs enable RF current to travel on alternate paths resulting more repeatable performance of the process chamber.

Thus, an improved substrate support design is needed.

SUMMARY

In one embodiment, a substrate support is provided which includes a body. An electrode and a ground shield assembly are disposed in the body. One or more heating elements are disposed within the ground shield assembly.

In another embodiment, a substrate support is provided which includes a body having a first surface and a second surface opposite the first surface. The first surface includes a plurality of mesas and a plurality of valleys. Each of the plurality of valleys is disposed between at least two of the plurality of mesas. An electrode is disposed in the body. Each of a plurality of portions of the electrode is aligned with one of the plurality of mesas. A ground shield assembly is disposed in the body and forms a lattice structure. One or more heating elements is disposed in the body and surrounded by the ground shield assembly.

In yet another embodiment, a process chamber is provided which includes a chamber body and a lid defining a process volume therein. A showerhead is disposed in the process volume and coupled to the lid. A stem extends from a bottom of the chamber body opposite the lid. A substrate support is disposed in the process volume on the stem. The substrate support includes a body, an electrode disposed in the body, and a ground shield assembly disposed in the body. One or more heating elements are disposed within the ground shield assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to apparatus for radio frequency (RF) grounding in process chambers, and methods of forming the same. In one embodiment, a heater is disposed in a substrate support. The heater is surrounded by a ground shield assembly. The substrate support also includes a multi-zone electrode disposed therein. The multi-zone electrode includes one or more portions of an electrode disposed in a plane. One or more portions of a multi-zone ground plane are interposed with the one or more portions of the electrode. That is, the multi-zone ground plane and the multi-zone electrode are coplanar with the one or more portions of the electrode alternating with one or more portions of the multi-zone ground plane throughout a plane of the substrate support.

Figure 1A:
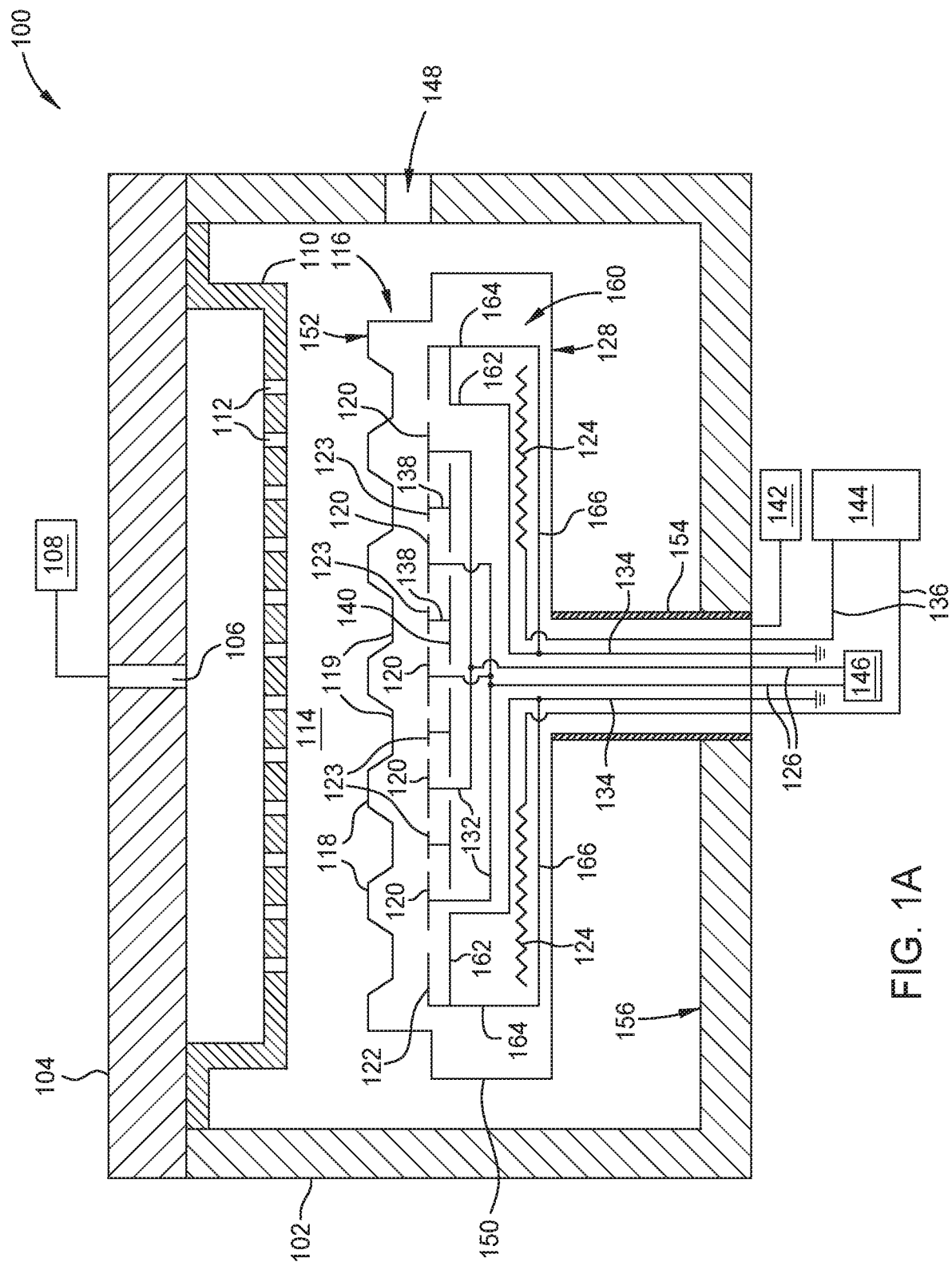
FIG. 1A illustrates a schematic sectional view of a process chamber according to some embodiments.
Figure 1B:
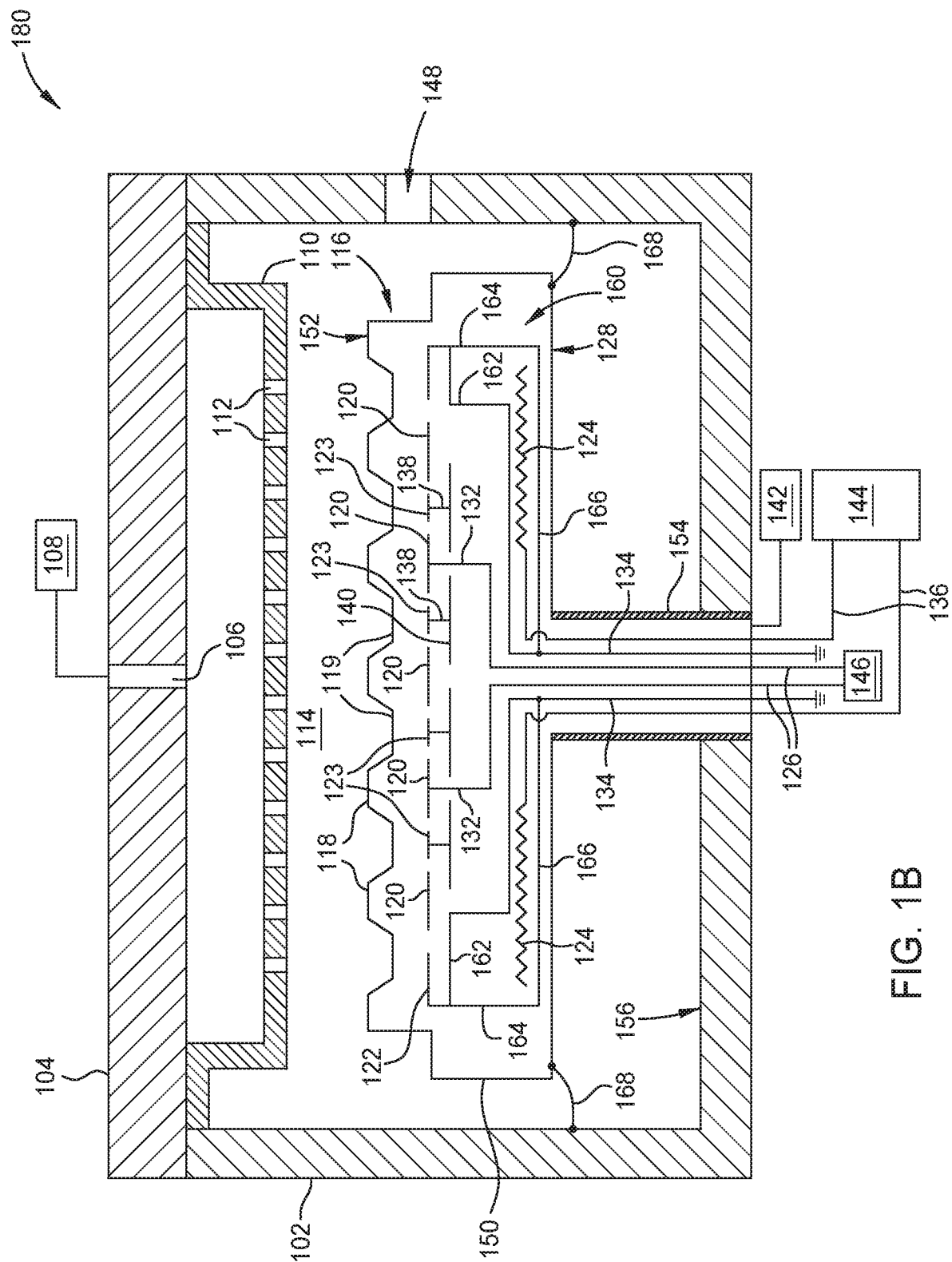
FIG. 1B illustrates a schematic sectional view of a process chamber according to some embodiments of the disclosure.

FIG. 1A illustrates a schematic view of a process chamber 100 according to some embodiments of the disclosure. FIG. 1B illustrates a schematic view of a process chamber 180 according to some embodiments of the disclosure. The process chamber 180 is similar to the process chamber 100 except for a polarity of an electrode 120, discussed below.

The process chamber 100 includes a chamber body 102 and a lid 104 defining a process volume 114 therein. A bottom 156 of the chamber body 102 is opposite the lid 104. A port 106 is formed through the lid 104. A gas source 108 is in fluid communication with the port 106. A showerhead 110 is coupled to the lid 104. A plurality of openings 112 are formed through the showerhead 110. The gas source 108 is in fluid communication with the process volume 114 via the port 106 and the openings 112.

A substrate support 116 is moveably disposed in the process volume 114 opposite the lid 104. The substrate support 116 includes a support body 150 disposed on a stem 154. The support body 150 includes a support surface 152 disposed opposite the stem 154 and facing the showerhead 110. An opening 148 is formed through the chamber body 102 between the lid 104 and the bottom 156. During operation, a substrate (not shown) is loaded onto the support surface 152 through the opening 148. An actuator 142 is coupled to the substrate support 116 to move the substrate support 116 toward and away from the showerhead 110 for loading and processing the substrate thereon.

The support surface 152 includes one or more mesas 118. Each of the one or more mesas 118 is formed between two or more valleys 119. Each of the one or more valleys 119 may be formed by removing material from the support surface 152 between each of the one or more mesas 118.

The electrode 120 and a ground plate 122 are disposed within the support body 150. One or more portions of the electrode 120 are disposed in a plane that is substantially perpendicular to the support surface 152. One or more portions (e.g., ground plane portions) 123 of the ground plate 122 are also disposed in the plane. That is, the one or more portions of the electrode 120 and the one or more portions 123 of the ground plate 122 are interposed and alternate across the plane. In one embodiment, which can be combined with one or more embodiments discussed above, the electrode 120 and the ground plate 122 are alternating and coplanar. In another embodiment, which can be combined with one or more embodiments discussed above, the electrode 120 and the ground plate 122 are interdigitated and coplanar. In one embodiment, the electrode 120 is surrounded by ground portions 123 (e.g., in a coaxial structure). In one or more other embodiments, the electrode 120 couples with RF power and high voltage DC power while it is surrounded by ground portions 123 (e.g., in a coaxial structure).

As illustrated in FIG. 1A, the electrode 120 is monopolar. In other embodiments, which can be combined with one or more embodiments discussed above, the electrode 120 is bipolar as illustrated in FIG. 1B. Each of the one or more portions of the electrode 120 is vertically aligned with one of the one or more mesas 118. That is, each of the one or more portions of the electrode 120 is disposed between one of the one or more mesas 118 and the bottom 156 of the chamber body 102. Each of the one or more portions 123 of the ground plate 122 is aligned with one of the one or more valleys 119.

Each of the one or more portions of the electrode 120 is coupled to one of a plurality of radio frequency (RF) jumper leads 132. Each RF jumper lead 132 is coupled to one or more RF leads 126. The RF leads 126 are coupled to an RF power source 146. The RF power source 146 provides RF power to the one or more portions of the electrode 120.

In one embodiment, the electrode 120 comprises a plurality of electrodes (or electrode portions). Additionally, the ground plate 122 comprises a plurality of ground plates 122. Each of the electrodes 120 are adapted to receive RF power as well as chucking voltage from a DC power source from the RF power source 146 and the power source 144, respectively. The electrodes 120 are interdigitated with the RF jumper leads 132. Each of the RF jumper leads 132 are coaxially aligned with the ground plate 122 (e.g., ground portions 123 (e.g., in a coaxial structure)). When RF power is applied to the substrate support 116 (from the top or bottom of the substrate support 116), a symmetric ground return path is provided by the ground plate 122. This provides good film uniformity and/or minimizes arcing of stray plasma formation under the substrate support 116.

The DC power applied to the one or more portions of the electrode 120 facilitate generation of an electrostatic force to hold a substrate on the support surface 152. That is, the RF power may be provided to the one or more portions of the electrode 120 after the substrate is loaded onto the support surface 152 and during processing.

One or more heating elements 124 are disposed in the support body 150. The one or more heating elements 124 may be a resistive heater. The one or more heating elements 124 may be a spiraled coil or extend radially outward from a center of the support body 150. The one or more heating elements 124 are coupled to a power source 144 via one or more heater power leads 136. In some embodiments, which can be combined with one or more embodiments described above, the power source 144 is a direct current (DC) power source. In some embodiments, which can be combined with one or more embodiments described above, the one or more heating elements 124 multi-zone heating of the support body 150. As shown in FIGS. 1A and 1B, the one or more heating elements 124 are arranged in a plane substantially parallel to and beneath the plane of the ground plate 122. However, other configurations are also contemplated.

The one or more heating elements 124 are surrounded by a grounding shield assembly 160. The grounding shield assembly 160 includes a first member 162, a second member 164, and a third member 166. Each of the members 162, 164, 166 may be, for example, an electrically conductive mesh, wire, or sheet, among other electrically conductive materials, to facilitate construction of a faraday cage around the one or more heating elements 124. The third member 166 is disposed opposite the first member 162. The third member 166 may include one or more sections which may be substantially parallel or substantially perpendicular to the first member 162 and the second member 164.

Each of the one or more portions 123 of the ground plate 122 is coupled to a common ground 140 via one or more ground jumpers 138. The common ground 140 is coplanar with at least a portion of the first member 162. One or more of the ground jumpers 138 may be coupled directly to the first member 162. The first member 162 and the third member 166 are directly coupled to ground via one or more ground leads 134.

The first member 162 of the ground shield assembly 160 is coupled directly to and extends between the second member 164 and the ground lead 134. The second member 164 is coupled to and extends between the first member 162 and the third member 166. The third member 166 is coupled to and extends between the second member 164 and the ground lead 134. The one or more heating elements 124 are disposed between the first member 162 and the third member 166 and between the second member 164 and the ground lead 134. The third member 166 is disposed within the body 150 of the substrate support 116. In some embodiments, which can be combined with one or more embodiments described above, the third member 166 is disposed external to and along a bottom surface 128 of the body 150 of the substrate support 116.

In some embodiments, which can be combined with one or more embodiments described above, one or more of the first member 162, the second member 164, the third member 166, and the ground lead 134 is a flexible conductor, such as a cable or wire. In other embodiments, which can be combined with one or more embodiments described above, one or more of the first member 162, the second member 164, the third member 166, and the ground lead 134 is a rigid conductor.

In operation, one or more gases are provided to the process volume 114 from the gas source 108. The gas flows through the port 106 in the lid 104 and through the openings 112 in the showerhead 110. DC power is supplied to the one or more heating elements 124 via the power source 144. The one or more heating elements 124 heat the substrate support 116 and a substrate disposed on the support surface 152 to a process temperature.

RF power is supplied to the electrode 120 via the RF power source 146. The RF power activates the gas in the process volume 114 and generates a plasma therein. The plasma is used to deposit a material on the substrate. The RF power has a tendency to return the RF power source 146. However, RF return current may travel to other components of the process chamber 100, such as the one or more heating elements 124 and the power source 144 connected thereto, resulting in damage to one or more of those components.

The ground shield assembly 160 creates a lattice like structure around the one or more heating elements 124 and substantially reduces an occurrence of RF return current traveling to the one or more heating elements 124, the heater power leads 136, and the power source 144. That is, the ground shield assembly 160 provides a low impedance path to ground such that any RF current traveling through the support body 150 is induced in the ground shield assembly 160 and directed to ground.

In some embodiments, the ground shield assembly 160 is coupled to the chamber body 102 via one or more ground straps 168 (shown in FIG. 1B). In that case, the chamber body 102 is coupled to ground. The ground straps 168 provide a low impedance ground path for any RF current traveling through the ground shield assembly 160.

Figure 2:
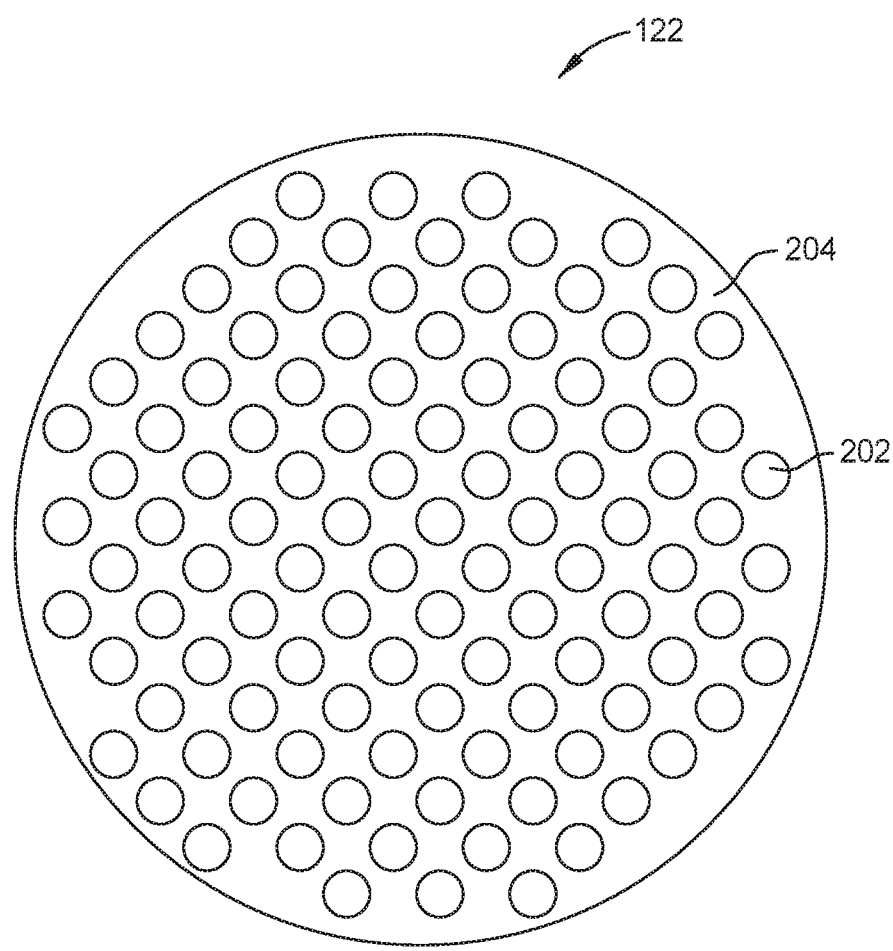
FIG. 2 illustrates a top schematic view of a substrate support according to some embodiments.

FIG. 2 illustrates a top schematic view of a ground plate 122 according to some embodiments of the disclosure. The ground plate 122 includes a plurality of holes 202 formed therethrough. That is, each of the plurality of holes 202 is surrounded by a portion 204 of the ground plate 122.

In operation, portions of an electrode, such as the electrode 120 discussed with respect to FIGS. 1A and 1B, are positioned in the holes 202 such that the electrode 120 is coplanar with the ground plate 122. The portions of the electrode 120 and the ground plate 122 are separated by a space (not shown) such that the portions of the electrode 120 do not contact the ground plate 122. Each of the holes 202 is aligned with a mesa of the substrate support, such as the mesas 118 and substrate support 116 discussed with respect to FIGS. 1A and 1B.

In some embodiments, the portions of the electrode 120 are positioned above the ground plate 122. In this way, an occurrence of the electric field produced by the electrode 120 being shunted by the ground plate 122 (and the grounding shield assembly 160) is substantially reduced. The electric field would be shunted if the electrode 120 is positioned below the ground plate 122.

Figure 3:
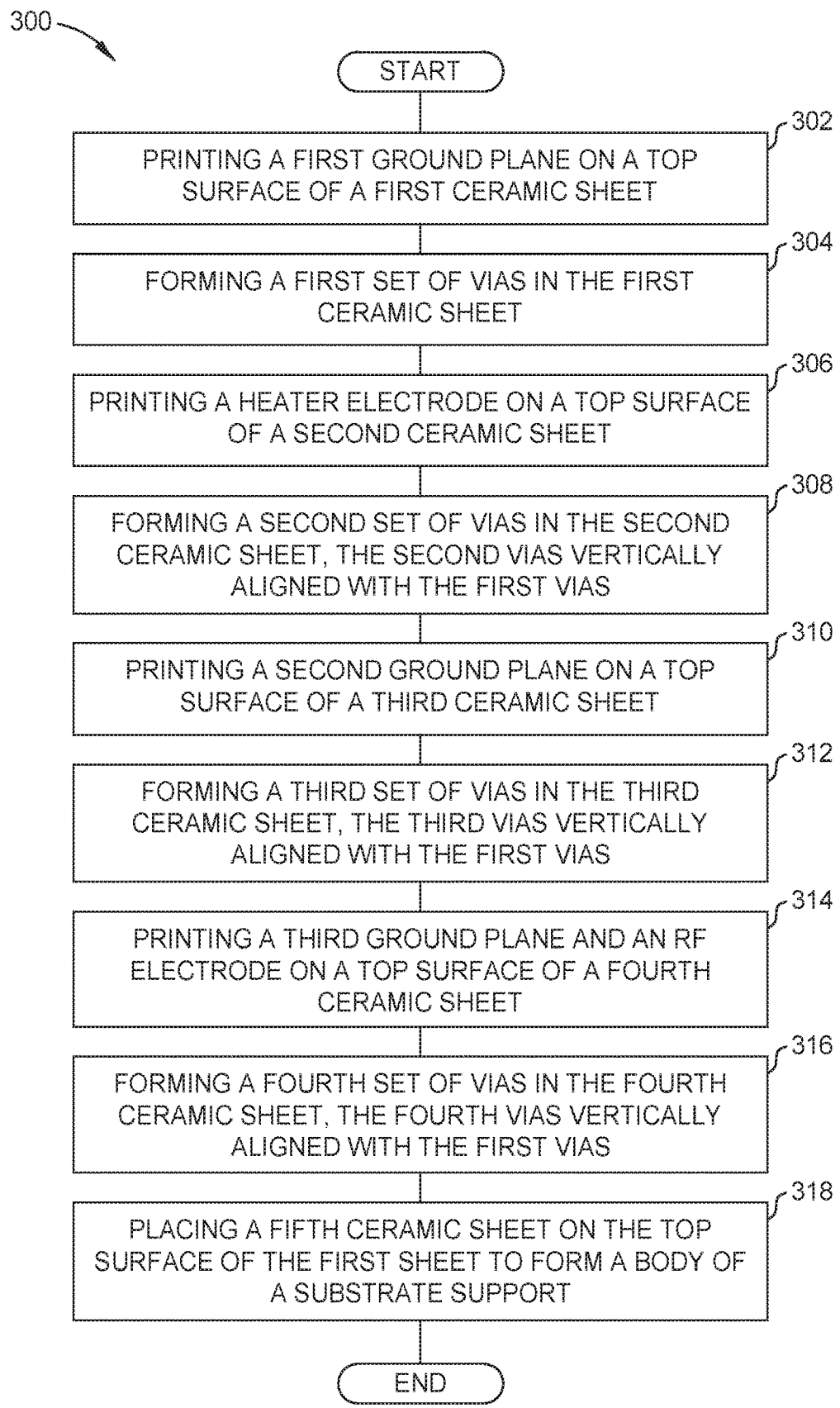
FIG. 3 is a method for forming a substrate support, according to some embodiments.

FIG. 3 is a method 300 for forming a substrate support, according to some embodiments. The method 300 begins at operation 302 where a first ground plane is printed, for example, via additive manufacturing or screen printing, on a top surface of a first ceramic sheet. The ground plane may be fabricated from a conductive material. At operation 304, a first set of vias is formed in the first ceramic sheet.

At operation 306, a heater electrode is printed on a top surface of a second ceramic sheet. The heater electrode may be fabricated from a conductive material. At operation 308, a second set of vias is formed in the second ceramic sheet. The second vias are vertically aligned with the first vias. At operation 310, a second ground plane is printed on a top surface of a third ceramic sheet. At operation 312, a third set of vias is formed in the third ceramic sheet. The third vias are vertically aligned with the first vias.

At operation 314, a third ground plane and an RF electrode are printed on a top surface of a fourth ceramic sheet. The third ground plane and the RF electrode are at least partially coplanar. At operation 316, a fourth set of vias is formed in the fourth ceramic sheet. The fourth vias are vertically aligned with the first vias. At operation 318, a fifth ceramic sheet is positioned on the top surface of the first sheet to form a body of a substrate support. Each of the ceramic sheets may be fabricated from a ceramic containing material, such as aluminum nitride.

While the foregoing is directed to embodiments of the present disclosure, other and further embodiments of the disclosure may be devised without departing from the basic scope thereof, and the scope thereof is determined by the claims that follow.

What is claimed is:

1. A substrate support, comprising:
   a ceramic body;
   an electrode disposed in the ceramic body;
   a ground plate disposed in the ceramic body, wherein portions of the ground plate are interdigitated with portions of the electrode; and
   one or more heating elements disposed within the ceramic body.

2. The substrate support of claim 1, wherein
   the portions of the ground plate are coplanar with the electrode.

3. The substrate support of claim 1, further comprising a ground shield assembly disposed in the ceramic body, the ground shield assembly comprises:
   one or more ground leads;
   a first conductive member opposite the one or more ground leads;
   a second conductive member extending between the one or more ground leads and the first conductive member; and
   a third conductive member opposite the second conductive member and extending between the one or more ground leads and the first conductive member.

4. The substrate support of claim 3, wherein the first conductive member is radially outward of the one or more ground leads and the first conductive member extends from the second conductive member to the third conductive member.

5. A substrate support, comprising:
   a body having a first surface and a second surface opposite the first surface, the first surface comprising a plurality of mesas and a plurality of valleys, each of the plurality of valleys disposed between at least two of the plurality of mesas;
   an electrode disposed in the body, a plurality of portions of the electrode aligned with the plurality of mesas;
   a ground plate disposed in the body, wherein a plurality of portions of the ground plate are aligned with the plurality of valleys; and
   one or more heating elements disposed in the body.

6. The substrate support of claim 5, further comprising a ground shield assembly disposed in the body, the ground shield assembly comprises:
   one or more ground leads;

a plurality of first members opposite and radially outward of the one or more ground leads;
a plurality of second members, each of the plurality of second members extending from the one or more ground leads to the plurality of first members; and
a plurality of third members opposite the plurality of second members, each of the plurality of third members extending from the one or more ground leads to the plurality of first members.

7. The substrate support of claim 6, wherein an impedance of the ground shield assembly is less than an impedance of one or more power leads coupled to the electrode.

8. The substrate support of claim 5, wherein the electrode is monopolar.

9. The substrate support of claim 5, wherein the electrode is bipolar.

10. The substrate support of claim 5, wherein the portions of the ground plate and the portions of the electrode are coplanar.

11. A process chamber, comprising:
a chamber body and a lid defining a process volume therein;
a showerhead disposed in the process volume and coupled to the lid;
a stem extending from a bottom of the chamber body opposite the lid; and
a substrate support disposed in the process volume on the stem, the substrate support comprising:
a body;
an electrode disposed in the body;
a ground plate disposed in the body, wherein portions of the ground plate are interdigitated with portions of the electrode; and
one or more heating elements disposed within the body.

12. The process chamber of claim 11, wherein the portions of the ground plate are coplanar with the portions of the electrode.

13. The process chamber of claim 12, further comprising a ground shield assembly disposed in the body, the ground shield assembly comprises:
one or more ground leads;
a plurality of first member opposite and radially outward of the one or more ground leads;
a plurality of second member extending from the one or more ground leads to the first member; and
a plurality of third member extending from the one or more ground leads to the first member and opposite the second member.

14. The process chamber of claim 13, wherein the ground shield assembly forms a lattice structure surrounding the one or more heating elements.

15. The substrate support of claim 1, wherein the ground plate comprises a plurality of holes defining the portions of the ground plate, and the portions of the electrode are positioned within the plurality of holes.

16. The substrate support of claim 1, wherein the portions of the ground plate surround the portions of the electrode to form one or more coaxial structures.

17. The substrate support of claim 5, wherein the ground plate comprises a plurality of holes defining the portions of the ground plate, the portions of the electrode positioned within the plurality of holes.

18. The substrate support of claim 5, wherein the portions of the ground plate surround the portions of the electrode to form one or more coaxial structures.

19. The process chamber of claim 11, wherein the ground plate comprises a plurality of holes defining the portions of the ground plate, the portions of the electrode positioned within the plurality of holes.

20. The process chamber of claim 11, wherein the portions of the ground plate surround the portions of the electrode to form one or more coaxial structures.

* * * * *